United States Patent
Wakui et al.

(10) Patent No.: US 9,745,510 B2
(45) Date of Patent: Aug. 29, 2017

(54) FLUORIDE FLUORESCENT MATERIAL AND METHOD FOR PRODUCING THE SAME

(71) Applicant: Nichia Corporation, Anan-shi (JP)

(72) Inventors: Sadakazu Wakui, Tokushima (JP); Shoji Hosokawa, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 232 days.

(21) Appl. No.: 14/683,046

(22) Filed: Apr. 9, 2015

(65) Prior Publication Data
US 2015/0291878 A1 Oct. 15, 2015

(30) Foreign Application Priority Data

Apr. 10, 2014 (JP) .................. 2014-080656

(51) Int. Cl.
*C09K 11/61* (2006.01)
*H01L 33/50* (2010.01)

(52) U.S. Cl.
CPC .......... *C09K 11/617* (2013.01); *C09K 11/616* (2013.01); *H01L 33/502* (2013.01);
(Continued)

(58) Field of Classification Search
CPC ... C09K 11/616; C09K 11/617; C09K 11/675; C09K 11/628; C09K 11/645;
(Continued)

(56) References Cited

U.S. PATENT DOCUMENTS

2012/0256125 A1 10/2012 Kaneyoshi et al.
2014/0264418 A1 9/2014 Murphy et al.
(Continued)

FOREIGN PATENT DOCUMENTS

| DE | WO 2013121355 A1 * | 8/2013 | .......... H01L 33/502 |
|----|---|---|---|
| JP | 2010-232381 A | 10/2010 | |
| JP | 2012-224536 A | 11/2012 | |
| JP | 2013-533363 A | 8/2013 | |
| JP | 2014-514369 A | 6/2014 | |
| JP | 2016-517464 A | 6/2016 | |
| WO | WO-2012/015581 A1 | 2/2012 | |
| WO | WO-2013/088313 A1 | 6/2013 | |
| WO | WO2013/121355 † | 8/2013 | |

(Continued)

OTHER PUBLICATIONS

Notification of Reasons for Refusal issued in Japanese Patent Application No. 2014-080656 dated Sep. 27, 2016.

*Primary Examiner* — Matthew E Hoban
*Assistant Examiner* — Lynne Edmondson
(74) *Attorney, Agent, or Firm* — Foley & Lardner LLP (57) ABSTRACT

A method for producing a fluoride fluorescent material includes: subjecting a mixture that contains a fluoride compound in a liquid medium to a pressurization treatment and a heating treatment, the fluoride compound having a chemical composition represented by the following formula: $A_2[M_{1-a}Mn^{4+}{}_aF_6]$. A is at least one cation selected from the group consisting of $K^+$, $Li^+$, $Na^+$, $Rb^+$, $Cs^+$ and $NH_4^+$, M is at least one element selected from the group consisting of Group 4 elements and Group 14 elements, and a is a number that satisfies $0 < a < 0.2$. The pressurization treatment is performed at a pressure of 1.5 MPa or higher.

6 Claims, 5 Drawing Sheets

(52) U.S. Cl.
CPC ............... *H01L 2224/48247* (2013.01); *H01L 2224/48257* (2013.01); *H01L 2224/73265* (2013.01)

(58) Field of Classification Search
CPC . C09K 11/665; C09K 11/664; C09K 11/0838; C09K 11/02; C09K 2211/181; C09K 2211/188; H01L 33/502; H01L 33/504; H01L 33/507; H01L 33/52; Y02B 20/181; H05B 33/14; Y10T 428/2991
USPC ...... 252/301.4 F, 301.4 H, 301.4 R, 301.6 F; 313/503, 486; 428/403; 362/97.1, 84; 257/98
See application file for complete search history.

(56) References Cited

U.S. PATENT DOCUMENTS

2014/0268655 A1* 9/2014 Murphy ............... C09K 11/616
362/97.1
2015/0048399 A1* 2/2015 Weiler ................. H01L 33/502
257/98

FOREIGN PATENT DOCUMENTS

WO    WO-2013/121355 A1    8/2013
WO    WO2014/152787    †   9/2014

\* cited by examiner
† cited by third party

FLUORIDE FLUORESCENT MATERIAL AND METHOD FOR PRODUCING THE SAME

CROSS-REFERENCE TO RELATED APPLICATIONS

This application claims priority to Japanese Patent Application No. 2014-080656 filed on Apr. 10, 2014. The entire disclosure of Japanese Patent Application No. 2014-080656 is hereby incorporated herein by reference.

BACKGROUND OF THE INVENTION

Field of the Invention

The present disclosure relates to a fluoride fluorescent material and a method for producing the fluoride fluorescent material.

Description of Related Art

A light emitting diode (LED) is a semiconductor light emitting element produced from a metal compound such as gallium nitride (GaN). The semiconductor light emitting element is combined with fluorescent materials for the development of various light emitting devices that emit light of white color, bulb color, orange color and so on. These light emitting devices that emit light of white color and so on are obtained according to the principle of color mixing of light. As methods for emitting white light, a method using a light emitting element that emits ultraviolet rays and three fluorescent materials that emit light of red color (R), green color (G) and blue color (B), respectively, and a method using a light emitting element that emits light of blue color and a fluorescent material that emits light of yellow color etc. are well known. Light emitting devices adopting a method using a light emitting element that emits light of blue color and a fluorescent material that emits light of yellow color etc. are desired in a wide range of fields such as those of backlight for liquid crystals, general lighting, in-vehicle lighting and displays. Fluorescent materials to be used in light emitting devices for the application of backlight for liquid crystals, among the above-mentioned fields, are required to have not only high light-emitting efficiency but also a good color purity for reproducing a wide range of colors on chromaticity coordinates. Particularly, fluorescent materials to be used in light emitting devices for the application of backlight for a liquid crystal display are required to have compatibility of combination with color filters, and fluorescent materials having a narrow half-value width of an emission peak are desired.

For example, as red light emitting fluorescent materials having an excitation band in a blue color region and having a narrow half-value width of an emission peak, fluoride fluorescent materials having compositions of $K_2AlF_5:Mn^{4+}$, $K_3AlF_6:Mn^{4+}$, $K_3GaF_6:Mn^{4+}$, $Zn_2AlF_7:Mn^{4+}$, $KIn_2F_7:Mn^{4+}$, $K_2SiF_6:Mn^{4+}$, $K_2TiF_6:Mn^{4+}$, $K_3ZrF_7:Mn^{4+}$, $Ba_{0.65}Zr_{0.35}F_{2.70}:Mn^{4+}$, $BaTiF_6:Mn^{4+}$, $K_2SnF_6:Mn^{4+}$, $Na_2TiF_6:Mn^{4+}$, $Na_2ZrF_6:Mn^{4+}$, $KRbTiF_6:Mn^{4+}$, $K_2Si_{0.5}Ge_{0.5}F_6:Mn^{4+}$ and the like are known, and various attempts are made to improve methods for producing these fluoride fluorescent materials (see JP 2012-224536 A).

SUMMARY OF THE INVENTION

A method for producing a fluoride fluorescent material includes subjecting a mixture that contains a fluoride compound in a liquid medium to a pressurization treatment and a heating treatment. The fluoride compound has a chemical composition represented by the following formula (I).

$$A_2[M_{1-a}Mn^{4+}{}_aF_6] \qquad (I)$$

In the formula (I), A is at least one cation selected from the group consisting of $K^+$, $Li^+$, $Na^+$, $Rb^+$, $Cs^+$ and $NH_4^+$, M is at least one element selected from the group consisting of Group 4 elements and Group 14 elements, and a represents a number that satisfies $0<a<0.2$.

The method can produce a fluoride fluorescent material that has excellent durability.

DETAILED DESCRIPTION OF EMBODIMENT

It is desired to put into practical use a red light emitting $Mn^{4+}$-activated fluoride fluorescent material having a narrow half-value width of an emission peak. In conventional techniques, however, there is room for improvement in durability of the fluoride fluorescent material, and the fluoride fluorescent material is not satisfactorily used in severe environments such as those of lighting applications.

In view of the above situations, an object of the present disclosure is to provide a red light emitting fluorescent material excellent in durability, and a method for producing the red light emitting fluorescent material.

Specific means for achieving the above-mentioned object are as follows, and the present disclosure includes the following aspects.

A first aspect of the present disclosure is a method for producing a fluoride fluorescent material that includes subjecting a mixture that contains a fluoride compound in a liquid medium to a pressurization treatment and a heating treatment and the fluoride compound has a chemical composition represented by the following formula (I).

$$A_2[M_{1-a}Mn^{4+}{}_aF_6] \qquad (I)$$

In the formula (I), A is at least one cation selected from the group consisting of $K^+$, $Li^+$, $Na^+$, $Rb^+$, $Cs^+$ and $NH_4^+$, M is at least one element selected from the group consisting of Group 4 elements and Group 14 elements, and a represents a number that satisfies $0<a<0.2$.

A second aspect of the present disclosure is a fluoride fluorescent material that exhibits a rate of decrease in light-emitting energy efficiency of 5% or less after the fluoride fluorescent material is irradiated with laser light having a wavelength of 445 nm at an optical density of 3.5 W/cm² for 300 seconds, and the fluoride fluorescent material having a chemical composition represented by the formula (I).

A third aspect of the present disclosure is a fluoride fluorescent material that exhibits a reflectance at a wavelength of 510 nm of 85% or more, and the fluoride fluorescent material having a chemical composition represented by the formula (I).

A fourth aspect of the present disclosure is a fluoride fluorescent material that exhibits a rate of decrease in emission brightness of less than 4% after the fluoride fluorescent material is left standing under an environment at a temperature of 85° C. and a relative humidity of 85% for 100 hours, and the fluoride fluorescent material having a chemical composition represented by the general formula (I).

A fifth aspect of the present disclosure is a light emitting device that includes a fluoride fluorescent material obtained by the method of the first aspect or the fluoride fluorescent material of any one of the second to fourth aspects and a light source that emits light having a peak wavelength in a range of 380 nm to 485 nm.

According to the present disclosure, there can be provided a red light emitting fluorescent material excellent in durability, and a method for producing the red light emitting fluorescent material.

A fluoride fluorescent material, a method for producing the fluoride fluorescent material, and a light emitting device according to the present invention will be described below by way of an embodiment and examples. It is to be noted that the embodiment shown below illustrates a fluoride fluorescent material, a method for producing the fluoride fluorescent material, and a light emitting device for embodying the technical concept of the present invention, and the present invention does not intend to limit a fluoride fluorescent material, a method for producing the fluoride fluorescent material, and a light emitting device to the following.

The relationship between a color name and a chromaticity coordinate, the relationship between a wavelength range of light and a color name of monochromatic light, and the like conform to JIS Z8110. Specifically, the range of 380 nm to 410 nm corresponds to purple, the range of 410 nm to 455 nm corresponds to bluish purple, the range of 455 nm to 485 nm corresponds to blue, the range of 485 nm to 495 nm corresponds to bluish green, the range of 495 nm to 548 nm corresponds to green, the range of 548 nm to 573 nm corresponds to yellowish green, the range of 573 nm to 584 nm corresponds to yellow, the range of 584 nm to 610 nm corresponds to yellowish red, and the range of 610 nm to 780 nm corresponds to red. In this specification, the term "step" includes not only independent steps, but also a step that cannot be clearly distinguished from other steps as long as an anticipated effect of the step is achieved. The numerical value range shown by the term "to" shows a range including values, which are described before and after "to," as minimum and maximum values, respectively. When a plurality of substances corresponding to each component exist in a composition, the content of each component in the composition means the total amount of the plurality of substances existing in the composition unless otherwise specified.

Method for Producing Fluoride Fluorescent Material

The method for producing a fluoride fluorescent material according to this embodiment is a method for producing a fluoride fluorescent material, including the step of subjecting a mixture, which contains a fluoride and a liquid medium, to a pressurization treatment and a heating treatment, the fluoride having a chemical composition represented by the following formula (I).

$$A_2[M_{1-a}Mn^{4+}{}_aF_6] \tag{I}$$

In the formula (I), A is at least one cation selected from the group consisting of $K^+$, $Li^+$, $Na^+$, $Rb^+$, $Cs^+$ and $NH_4{}^+$, M is at least one element selected from the group consisting of Group 4 elements and Group 14 elements, and a represents a number that satisfies $0<a<0.2$.

By subjecting fluoride particles having a specific composition to a pressurization treatment and a heating treatment in a liquid medium, a fluoride fluorescent material excellent in emission brightness and durability can be obtained. This may be considered to be due to the following reason, for example: a crystal structure in the vicinity of $Mn^{4+}$ that activates the fluorescent material is stabilized, or crystal defects in the fluorescent material are reduced. The obtained fluorescent material has an increased reflectance at a wavelength of 510 nm, so that when the fluorescent material is used in a lighting application along with, for example, a green light emitting fluorescent material, a decrease in brightness in a green color region can be suppressed.

A fluoride fluorescent material obtained by the production method of this embodiment is excellent in durability. The durability of the fluoride fluorescent material can be evaluated by, for example, an accelerated test using laser light. The durability of the fluoride fluorescent material can also be evaluated by a method in which the fluoride fluorescent material is mounted in a light emitting device and the life thereof is determined. However, when the fluoride fluorescent material is mounted in a light emitting device and the life thereof is determined, it takes a thousand hours to several tens of thousands of hours for evaluation.

The durability evaluation test for the fluoride fluorescent material using laser light can be conducted, for example, in accordance with the following procedure.

A semiconductor laser that emits light having a wavelength of 445 nm is provided, and temperature control is performed for stabilizing the optical output. The fluoride fluorescent material is set in a cell for powder brightness measurement. The fluoride fluorescent material in the cell is irradiated with light outputted from the semiconductor laser. At this time, the current applied to the semiconductor laser is adjusted so that the optical density is 3.5 W/cm². Light from a section irradiated with laser light is taken in a photomultiplier tube to measure a change in powder brightness. At this time, it is preferred that laser light reflected from the fluorescent material is eliminated using an optical filter in order to eliminate influences of laser light on the powder brightness. Further, a change in powder brightness can be evaluated as, for example, a rate (%) of decrease in light-emitting energy efficiency with respect to excitation energy. Excitation energy can be calculated from the reflectance of light at an excitation wavelength.

The rate (%) of decrease in light-emitting energy efficiency with respect to excitation energy in the durability evaluation test for the fluoride fluorescent material using laser light is preferably 5% or less, more preferably 4% or less, further preferably 2% or less under a laser irradiation condition in which laser light having a wavelength of 445 nm is applied at an optical density of 3.5 W/cm² for 300 seconds.

When the durability of the fluoride fluorescent material is evaluated by a method in which the fluoride fluorescent material is mounted in a light emitting device and the life thereof is determined, a light emitting device for evaluation is prepared by performing packaging using a 450 nm-blue LED and a sealing resin containing a green fluorescent material in addition to the fluoride fluorescent material. The durability can be evaluated by an amount of change in x value on chromaticity coordinates after elapse of a predetermined period of time while the obtained light emitting device for evaluation is made to continuously emit light at a current value of, for example, 150 mA. The durability may also be evaluated by an amount of change in total luminous flux associated with continuous emission. Further, when the fluoride fluorescent material is mounted in a light emitting device to evaluate the durability, the evaluation time can be shortened by accelerating degradation with the ambient temperature set to, for example, 85° C.

Fluoride Compound

A fluoride compound, which is used in the method for producing a fluoride fluorescent material and has a chemical composition represented by the formula (I), itself functions as a red light emitting fluorescent material. The production method of this embodiment is capable of improving the durability of a fluoride fluorescent material to be obtained without impairing the function, as a fluorescent material, of a fluoride compound having a chemical composition represented by the formula (I).

The particle size and particle size distribution of the fluoride compound having a chemical composition represented by the formula (I) (hereinafter, also referred to simply as a "fluoride compound") are not particularly limited. However, from the viewpoint of emission intensity and durability, the particle size distribution is preferably a single peak particle size distribution, more preferably a single peak particle size distribution having a narrow distribution width. The surface area and bulk density of the fluoride compound are not particularly limited.

The fluoride compound is a fluorescent material activated with $Mn^{4+}$, and can emit light of red color by absorbing light in a short-wavelength region of visible light. Excitation light that is light in a short-wavelength region of visible light is preferably light mainly in a blue color region. Specifically, excitation light has a main peak wavelength preferably in a range of 380 nm to 500 nm, more preferably in a range of 380 nm to 485 nm, further preferably in a range of 400 nm to 485 nm, especially preferably in a range of 440 nm to 480 nm in an intensity spectrum.

The emission wavelength of the fluoride compound is not particularly limited as long as light emitted by the fluoride compound has a wavelength longer than that of excitation light, and is red. The emission spectrum of the fluoride compound has a peak wavelength preferably in a range of 610 nm to 650 nm. The half-value width of the emission spectrum is preferably small, specifically 10 nm or less.

A in the formula (I) is at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$). Preferably, A includes at least potassium ion ($K^+$), and may further include at least one cation selected from the group consisting of lithium ion ($Li^+$), sodium ion ($Na^+$), rubidium ion ($Rb^+$), cesium ion ($Cs^+$) and ammonium ion ($NH_4^+$). At this time, the content of potassium ion in A is not particularly limited, and for example, preferably 90% by mole or more, more preferably 95% by mole or more.

M in the formula (I) is at least one element selected from the group consisting of Group 4 elements and Group 14 elements. From a viewpoint of light-emitting characteristics, M is preferably at least one element selected from the group consisting of titanium (Ti), zirconium (Zr), hafnium (Hf), silicon (Si), germanium (Ge) and tin (Sn), more preferably includes silicon (Si) or silicon (Si) and germanium (Ge), and is further preferably silicon (Si) or silicon (Si) and germanium (Ge).

When M includes silicon (Si) or silicon (Si) and germanium (Ge), at least one element of Si and Ge may be partially substituted with at least one element selected from the group consisting of Group 4 elements including Ti, Zr and Hf and Group 14 elements including C and Sn. In this case, the total content of Si and Ge in M is not particularly limited, and for example, preferably 90% by mole or more, more preferably 95% by mole or more.

Liquid Medium

In the production method of this embodiment, a mixture containing the fluoride compound in a liquid medium is prepared, and the obtained mixture is subjected to a pressurization treatment and a heating treatment. By performing the treatment in a liquid medium, the treating effect can be more evenly imparted to the fluoride compound. The composition of the liquid medium is not particularly limited, and the liquid medium may be appropriately selected from liquids that are usually used according to the purpose or the like. Specific examples of the liquid medium may include water; and organic solvents including alcohol solvents such as methanol, ethanol and isopropyl alcohol, ketone solvents such as acetone and methyl ethyl ketone, and ether solvents such as diethyl ether and diisopropyl ether. The liquid medium may be a substance that is gaseous at normal pressure but is liquefied by pressurization, or may be a substance that is solid at normal temperature but is liquefied by heating. Preferably, the liquid medium contains at least water.

The liquid medium may be used alone, or used in combination of two or more thereof.

The liquid medium may further contain a component soluble in the liquid medium. Examples of the component soluble in the liquid medium may include inorganic acids such as hydrogen fluoride (HF), hexafluorosilicic acid ($H_2SiF_6$) and nitric acid ($HNO_3$); peroxides such as hydrogen peroxide; and inorganic acid salts containing potassium ions, such as potassium hydrogen fluoride ($KHF_2$), potassium nitrate ($KNO_3$) and potassium fluoride (KF). Particularly, the liquid medium preferably contains at least potassium ions, and more preferably contains at least an inorganic acid salt containing potassium ions.

The component soluble in the liquid medium may be used alone, or used in combination of two or more thereof.

When the liquid medium contains potassium ions, the concentration of potassium ions is not particularly limited, and may be appropriately selected according to the purpose or the like. The concentration of potassium ions may be, for example, 5 to 10% by mass.

The used amount of the liquid medium is not particularly limited, and may be appropriately selected according to the treatment method or the like. The used amount of the liquid medium may be, for example, 100 to 160 parts by mass, and is preferably 130 to 160 parts by mass, based on 100 parts by mass of the fluoride compound.

Pressurization Treatment

Conditions for the pressurization treatment are not particularly limited, and may be appropriately selected according to the purpose or the like. The pressure for the pressurization treatment is preferably 1.5 MPa or more, more preferably 2.5 MPa or more, further preferably 5.0 MPa or more as a calculated value from a viewpoint of improvement in durability. The upper limit of the pressure is not particularly limited, but is preferably 30 MPa or less, more preferably 15 MPa or less from a viewpoint of durability and production efficiency.

The time for the pressurization treatment may be appropriately selected according to treatment conditions such as the pressure. The treatment time is, for example, preferably 4 hours or more, more preferably 6 hours or more, further preferably 8 hours or more from a viewpoint of improvement in durability. The upper limit of the treatment time is not particularly limited, but is preferably 48 hours or less, more preferably 24 hours or less, further preferably 20 hours or less from a viewpoint of durability and production efficiency.

For the pressurization treatment, for example, the mixture may be placed in a pressure-resistant closed vessel such as an autoclave, and pressurized. The pressurization method is not particularly limited, and may be appropriately selected from pressurization methods that are usually used. Specifically, for example, the pressurization treatment may be performed by reducing the volume of the pressure-resistant closed vessel, or by introducing a gas such as air or an inert gas under pressure, or the pressurization treatment may be performed under the vapor pressure of a liquid medium or the like by performing a heating treatment while maintaining a closed state.

The atmosphere in the pressurization treatment is not particularly limited, and may be an air atmosphere, or may be an inert gas atmosphere.

Heating Treatment

Conditions for the heating treatment are not particularly limited, and may be appropriately selected according to the purpose or the like. The temperature for the heating treatment is preferably 100° C. or higher, more preferably 120° C. or higher, further preferably 150° C. or higher from a viewpoint of improvement in durability. The upper limit of the temperature is not particularly limited, but is preferably 300° C. or lower, more preferably 200° C. or lower from a viewpoint of durability and production efficiency.

The amount of time for the heating treatment may be appropriately selected according to treatment conditions such as the temperature. The treatment time is, for example, preferably 4 hours or more, more preferably 8 hours or more from a viewpoint of improvement in durability. The upper limit of the treatment time is not particularly limited, but is preferably 24 hours or less, more preferably 20 hours or less from a viewpoint of durability and production efficiency.

The atmosphere in the heating treatment is not particularly limited, and may be an air atmosphere, or may be an inert gas atmosphere.

In the method for producing a fluoride fluorescent material, a pressurization treatment and a heating treatment are performed. The pressurization treatment and the heating treatment may be sequentially performed, or the treatments may be performed in a temporally overlapping manner. When the pressurization treatment and the heating treatment are performed in a temporally overlapping manner, for example, the pressurization treatment can be performed under the vapor pressure of the liquid medium by subjecting the mixture to the heating treatment with the mixture placed in a pressure-resistant closed vessel.

In the method for producing a fluoride fluorescent material, the treatment is performed preferably at a temperature of 120 to 300° C. and a pressure of 2.5 to 30 MPa for 8 to 48 hours, more preferably at a temperature of 150 to 200° C. and a pressure of 5.0 to 12 MPa for 6 to 24 hours.

The method for producing a fluoride fluorescent material may further include post-treatment steps such as a separation treatment, a purification treatment and a drying treatment of the fluoride fluorescent material in addition to the pressurization treatment and the heating treatment.

The method for producing a fluoride fluorescent material may further include a step of providing a fluoride compound having a chemical composition represented by the formula (I). The providing step may include a step of producing a fluoride having a chemical composition represented by the general formula (I).

The fluoride compound having a chemical composition represented by the formula (I) can be produced in the following manner: a first complex ion including a tetravalent manganese ion, at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$), and a second complex ion including at least one selected from Group 4 elements and Group 14 elements are brought into contact with one another in a liquid medium containing hydrogen fluoride.

The fluoride having a chemical composition represented by the general formula (I) can be produced by, for example, a production method including a step of mixing a solution a with a solution b (hereinafter, also referred to as a "first fluoride producing step"), the solution a containing at least a first complex ion including tetravalent manganese, a second complex ion including at least one element selected from Group 4 elements and Group 14 elements and a fluorine ion, and hydrogen fluoride, the solution b containing, at least, at least one cation selected from the group consisting of $K^+$, $Li^+$, $Na^+$, $Rb^+$, $Cs^+$ and $NH_4^+$, and hydrogen fluoride.

Solution a

The solution a is a hydrofluoric acid solution which contains a first complex ion including tetravalent manganese, and a second complex ion including at least one element selected from Group 4 elements and Group 14 elements and a fluorine ion.

The manganese source that forms the first complex ion including tetravalent manganese is not particularly limited as long as it is a compound including manganese. Specific examples of the manganese source capable of forming the solution a may include $K_2MnF_6$, $KMnO_4$ and $K_2MnCl_6$. Among them, $K_2MnF_6$ is preferred because it can stably exist in hydrofluoric acid as a $MnF_6$ complex ion while maintaining an oxidation number (tetravalent) that enables impartation of activity. Among the manganese sources, one containing at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$) can also serve as a cation source contained in the solution b. The manganese source that forms the first complex ion may be used alone, or may be used in combination of two or more thereof.

The concentration of the first complex ion in the solution a is not particularly limited. The lower limit of the concentration of the first complex ion in the solution a is normally 0.01% by mass or more, preferably 0.03% by mass or more, more preferably 0.05% by mass or more. The upper limit of the concentration of the first complex ion in the solution a is normally 50% by mass or less, preferably 40% by mass or less, more preferably 30% by mass or less.

The second complex ion preferably includes at least one element selected from the group consisting of titanium (Ti), zirconium (Zr), hafnium (Hf), silicon (Si), germanium (Ge) and tin (Sn), more preferably includes silicon (Si) or silicon (Si) and germanium (Ge). Further preferably, the second complex ion is a silicon fluoride complex ion.

For example, when the second complex ion includes silicon (Si), the second complex ion source is preferably a compound containing silicon and fluorine and having excellent solubility in a solution. Specific examples of the second complex ion source may include $H_2SiF_6$, $Na_2SiF_6$, ($NH_4$)$_2$$SiF_6$, $Rb_2SiF_6$ and $Cs_2SiF_6$. Among them, $H_2SiF_6$ is preferred because it has high solubility in water, and does not contain an alkali metal element as an impurity. The second complex ion source may be used alone, or may be used in combination of two or more thereof.

The lower limit of the concentration of the second complex ion in the solution a is normally 5% by mass or more, preferably 10% by mass or more, more preferably 15% by mass or more. The upper limit of the concentration of the second complex ion in the solution a is normally 80% by mass or less, preferably 70% by mass or less, more preferably 60% by mass or less.

The lower limit of the concentration of hydrogen fluoride in the solution a is normally 20% by mass or more, preferably 25% by mass or more, more preferably 30% by mass or more. The upper limit of the concentration of hydrogen fluoride in the solution a is normally 80% by mass or less, preferably 75% by mass or less, more preferably 70% by mass or less.

Solution b

The solution b contains, at least, at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$), and hydrogen fluoride, and may contain other components as necessary. The solution b is obtained as, for example, an aqueous solution of hydrogen fluoride which contains at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$).

Specific examples of the potassium source containing a potassium ion capable of forming the solution b may include water-soluble potassium salts such as KF, $KHF_2$, KOH, KCl, KBr, KI, potassium acetate and $K_2CO_3$. Among them, $KHF_2$ is preferred because it can be dissolved without decreasing the concentration of hydrogen fluoride in a solution, and has low heat of dissolution and hence high safety.

Examples of the sodium source containing a sodium ion capable of forming the solution b may include water-soluble sodium salts such as NaF, $NaHF_2$, NaOH, NaCl, NaBr, NaI, sodium acetate and $Na_2CO_3$.

Specific examples of the rubidium source containing a rubidium ion capable of forming the solution b may include water-soluble rubidium salts such as RbF, rubidium acetate and $Rb_2CO_3$.

Specific examples of the cesium source containing a cesium ion capable of forming the solution b may include water-soluble cesium salts such as CsF, cesium acetate and $Cs_2CO_3$.

Examples of the ammonium source containing a quaternary ammonium ion capable of forming the solution b may include water-soluble ammonium salts such as $NH_4F$, aqueous ammonia, $NH_4Cl$, $NH_4Br$, $NH_4I$, ammonium acetate and ($NH_4$)$_2$$CO_3$. The ion source that forms the solution b may be used alone, or may be used in combination of two or more thereof.

The lower limit of the concentration of hydrogen fluoride in the solution b is normally 20% by mass or more, preferably 25% by mass or more, more preferably 30% by mass or more. The upper limit of the concentration of hydrogen fluoride in the solution b is normally 80% by mass or less, preferably 75% by mass or less, more preferably 70% by mass or less.

The lower limit of the concentration of the cation in the solution b is normally 5% by mass or more, preferably 10% by mass or more, more preferably 15% by mass or more. The upper limit of the concentration of at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$) in the solution b is normally 80% by mass or less, preferably 70% by mass or less, more preferably 60% by mass or less.

The method for mixing the solution a with the solution b is not particularly limited, and the solutions may be mixed together by adding the solution a to the solution b while stirring the solution b, or the solutions may be mixed together by adding the solution b to the solution a while stirring the solution a. Alternatively, the solution a and the solution b may be introduced into a vessel, and stirred and mixed together.

When the solution a is mixed with the solution b, the first complex ion, at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$), and the second complex ion react at a predetermined ratio, so that crystals of an intended fluoride are precipitated. The precipitated crystals can be collected through solid-liquid separation by filtration or the like. The crystals may be washed with a solvent such as ethanol, isopropyl alcohol, water or acetone. Further, a drying treatment may be performed, and the crystals are dried normally at 50° C. or higher, preferably at 55° C. or higher, more preferably at 60° C. or higher, and normally at 110° C. or lower, preferably at 100° C. or lower, more preferably at 90° C. or lower. The drying time is not particularly limited as long as moisture deposited on the fluoride fluorescent material can be evaporated, and the drying time is, for example, about 10 hours.

In mixing of the solution a with the solution b, it is preferred to appropriately adjust the mixing ratio between the solution a and the solution b so that a fluoride as a product may have an intended composition in consideration of the difference between the charge composition of the solution a and the solution b and the composition of the fluoride to be obtained.

The fluoride compound having a chemical composition represented by the formula (I) can be produced by a production method including a step of mixing a first solution, a second solution and a third solution together (hereinafter, also referred to as a "second fluoride producing step"), the first solution containing at least a first complex ion including tetravalent manganese and hydrogen fluoride, the second solution containing, at least, at least one cation selected from the group consisting of potassium ion ($K^+$), lithium ion ($Li^+$), sodium ion ($Na^+$), rubidium ion ($Rb^+$), cesium ion ($Cs^+$) and ammonium ion ($NH_4^+$) and hydrogen fluoride, the third solution containing at least a second complex ion including at least one selected from the group consisting of Group 4 elements and Group 14 elements and a fluorine ion.

By mixing the first solution, the second solution and the third solution together, a fluoride compound having a desired composition and a desired weight median diameter can be easily and conveniently produced with excellent productivity.

First Solution

The first solution contains at least a first complex ion including tetravalent manganese and hydrogen fluoride, and may contain other components as necessary. The first solution is obtained as, for example, an aqueous solution of hydrofluoric acid containing a tetravalent manganese source. The manganese source is not particularly limited as long as it is a compound including manganese. Specific examples of the manganese source capable of forming the first solution may include $K_2MnF_6$, $KMnO_4$ and $K_2MnCl_6$. Among them, $K_2MnF_6$ is preferred because it can stably exist in hydrofluoric acid as a $MnF_6$ complex ion while maintaining an oxidation number (tetravalent) that enables impartation of activity. Among the manganese sources, one containing at least one cation selected from the group consisting of $K^+$, $Li^+$, $Na^+$, $Rb^+$, $Cs^+$ and $NH_4^+$ can also serve as at least one cation source contained in the second solution and selected from the group consisting of $K^+$, $Li^+$, $Na^+$, $Rb^+$, $Cs^+$ and $NH_4^+$. The manganese source that forms the first solution may be used alone, or may be used in combination of two or more thereof.

The lower limit of the concentration of hydrogen fluoride in the first solution is normally 20% by mass or more, preferably 25% by mass or more, more preferably 30% by mass or more. The upper limit of the concentration of hydrogen fluoride in the first solution is normally 80% by mass or less, preferably 75% by mass or less, more preferably 70% by mass or less. When the concentration of hydrogen fluoride is 30% by mass or more, the manganese source (e.g. $K_2MnF_6$) that forms the first solution has improved stability to hydrolysis, so that fluctuation in concentration of tetravalent manganese in the first solution is suppressed. Thus, the activation amount of manganese contained in the obtained fluoride fluorescent material can be easily controlled, so that variation (fluctuation) in light-emitting efficiency in the fluoride fluorescent material tends to be suppressed. When the concentration of hydrogen fluoride is 70% by mass or less, a decrease in boiling point of the first solution is suppressed, so that generation of a hydrogen fluoride gas is suppressed. Thus, the concentration of hydrogen fluoride in the first solution can be easily controlled, so that variation (fluctuation) in particle size of the obtained fluoride fluorescent material can be effectively suppressed.

The concentration of the first complex ion in the first solution is not particularly limited. The lower limit of the concentration of the first complex ion in the first solution is normally 0.01% by mass or more, preferably 0.03% by mass or more, more preferably 0.05% by mass or more. The upper limit of the concentration of the first complex ion in the first solution is normally 50% by mass or less, preferably 40% by mass or less, more preferably 30% by mass or less.

Second Solution

The second solution contains at least one cation selected from the group consisting of $K^+$, $Li^+$, $Na^+$, $Rb^+$, $Cs^+$ and $NH_4^+$ and hydrogen fluoride, and may contain other components as necessary. The second solution is obtained as, for example, an aqueous solution of hydrogen fluoride which contains at least one cation selected from the group consisting of $K^+$, $Li^+$, $Na^+$, $Rb^+$, $Cs^+$ and $NH_4^+$. Specific examples of the ion source containing an ion capable of forming the second solution may include water-soluble salts such as $NaF$, $NaHF_2$, $NaOH$, $NaCl$, $NaBr$, $NaI$, sodium acetate, $Na_2CO_3$, $RbF$, rubidium acetate, $Rb_2CO_3$, $CsF$, cesium acetate, $Cs_2CO_3$, $NH_4F$, aqueous ammonia, $NH_4Cl$, $NH_4Br$, $NH_4I$, ammonium acetate and $(NH_4)_2CO_3$ in addition to salts containing potassium, such as $KF$, $KHF_2$, $KOH$, $KCl$, $KBr$, $KI$, potassium acetate and $K_2CO_3$. Among them, at least $KHF_2$ is preferably used because it can be dissolved without decreasing the concentration of hydrogen fluoride in a solution, and has low heat of dissolution and hence high safety, and $NaHF_2$ is preferred as an ion source other than that of potassium. The ion source that forms the second solution may be used alone, or may be used in combination of two or more thereof.

The lower limit of the concentration of hydrogen fluoride in the second solution is normally 20% by mass or more, preferably 25% by mass or more, more preferably 30% by mass or more. The upper limit of the concentration of hydrogen fluoride in the second solution is normally 80% by mass or less, preferably 75% by mass or less, more preferably 70% by mass or less.

The lower limit of the concentration of at least one cation selected from the group consisting of $K^+$, $Li^+$, $Na^+$, $Rb^+$, $Cs^+$ and $NH_4^+$ in the second solution is normally 5% by mass or more, preferably 10% by mass or more, more preferably 15% by mass or more. The upper limit of the concentration of at least one cation selected from the group consisting of $K^+$, $Li^+$, $Na^+$, $Rb^+$, $Cs^+$ and $NH_4^+$ in the second solution is normally 80% by mass or less, preferably 70% by mass or less, more preferably 60% by mass or less.

Third Solution

The third solution contains at least a second complex ion including at least one element selected from the group consisting of Group 4 elements and Group 14 elements and a fluorine ion, and may contain other components as necessary. The third solution is obtained as, for example, an aqueous solution containing a second complex ion.

The second complex ion preferably includes at least one element selected from the group consisting of titanium (Ti), zirconium (Zr), hafnium (Hf), silicon (Si), germanium (Ge) and tin (Sn), more preferably includes silicon (Si) or silicon (Si) and germanium (Ge). Further preferably, the second complex ion is a silicon fluoride complex ion.

For example, when the second complex ion includes silicon (Si), the second complex ion source is preferably a compound containing silicon and fluorine and having excellent solubility in a solution. Specific examples of the second complex ion source may include $H_2SiF_6$, $Na_2SiF_6$, $(NH_4)_2SiF_6$, $Rb_2SiF_6$ and $Cs_2SiF_6$. Among them, $H_2SiF_6$ is preferred because it has high solubility in water, and does not contain an alkali metal element as an impurity. The second complex ion source that forms the third solution may be used alone, or may be used in combination of two or more thereof.

The lower limit of the concentration of the second complex ion in the third solution is normally 5% by mass or more, preferably 10% by mass or more, more preferably 15% by mass or more. The upper limit of the concentration of the second complex ion in the third solution is normally 80% by mass or less, preferably 70% by mass or less, more preferably 60% by mass or less.

The method for mixing the first solution, the second solution and the third solution together is not particularly limited, and the solutions may be mixed together by adding the second solution and the third solution to the first solution while stirring the first solution, by adding the first solution and the second solution to the third solution while stirring the third solution, or by adding the first solution and the third solution to the second solution while stirring the second solution. Alternatively, the first solution, the second solution and the third solution may be introduced into a vessel, and stirred and mixed together.

When the first solution, the second solution and the third solution are mixed together, the first complex ion, at least one cation selected from the group consisting of $K^+$, $Li^+$, $Na^+$, $Rb^+$, $Cs^+$ and $NH_4^+$, and the second complex ion react at a predetermined ratio, so that crystals of an intended fluoride compound having a chemical composition represented by the formula (I) are precipitated. The precipitated crystals can be collected through solid-liquid separation by filtration or the like. The crystals may be washed with a solvent such as ethanol, isopropyl alcohol, water or acetone. Further, a drying treatment may be performed, and the crystals are dried normally at 50° C. or higher, preferably at 55° C. or higher, more preferably at 60° C. or higher, and normally at 110° C. or lower, preferably at 100° C. or lower, more preferably at 90° C. or lower. The drying time is not particularly limited as long as moisture deposited on the fluoride can be evaporated, and the drying time is, for example, about 10 hours.

In mixing of the first solution, the second solution and the third solution together, it is preferred to appropriately adjust the mixing ratio among the first solution, the second solution and the third solution so that a fluoride as a product may have an intended composition in consideration of the difference between the charge composition of the first to third solutions and the composition of the fluoride to be obtained.

Fluoride Fluorescent Material

A first aspect of the fluoride fluorescent material of the present embodiment is a fluoride fluorescent material that exhibits a rate of decrease in light-emitting energy efficiency of 5% or less after the fluoride fluorescent material is irradiated with laser light having a wavelength of 445 nm at an optical density of 3.5 W/cm$^2$ for 300 seconds and the fluoride fluorescent material has a chemical composition represented by the formula (I). The rate of decrease in light-emitting energy efficiency is preferably 4% or less, more preferably 2% or less.

The rate of decrease in light-emitting energy efficiency is a rate (%) of decrease in light-emitting energy efficiency with respect to excitation energy after laser light irradiation, and is measured by the foregoing method.

A second aspect of the fluoride fluorescent material is a fluoride fluorescent material that exhibits a reflectance at a wavelength of 510 nm of 85% or more and the fluoride fluorescent material has a chemical composition represented by the formula (I). The reflectance at a wavelength of 510 nm is preferably 85.5% or more, more preferably 86% or more. The upper limit of the reflectance is not particularly limited, and is, for example, 87%.

The reflectance of the fluoride fluorescent material is, for example, measured under the condition of 25° C. using a fluorescence spectrophotometer F-4500 (manufactured by Hitachi High-Technologies Corporation).

A third aspect of the fluoride fluorescent material is a fluoride fluorescent material that exhibits a rate of decrease in emission brightness is less than 4% after the fluoride fluorescent material is left standing under an environment at a temperature of 85° C. and a relative humidity of 85% for 100 hours and the fluoride fluorescent material has a chemical composition represented by the formula (I). The rate of decrease in brightness is preferably 3% or less, more preferably 2% or less.

The emission brightness of the fluoride fluorescent material is, for example, measured under the condition of 25° C. using a fluorescence spectrophotometer F-4500 (manufactured by Hitachi High-Technologies Corporation).

The fluoride fluorescent material has at least one of, preferably two of, more preferably three of, especially preferably all of the features of the first to third aspects. The fluoride fluorescent material is preferably one obtained by the foregoing method for producing a fluoride fluorescent material.

Light Emitting Device

The light emitting device of the present embodiment includes the fluoride fluorescent material, and a light source that emits light having a wavelength in a range of 380 nm to 485 nm. The light emitting device may include other constituent members as necessary. Since the light emitting device includes the fluoride fluorescent material, excellent durability and excellent long-term reliability can be achieved. That is, the light emitting device including the fluoride fluorescent material can be suitably applied for use in severe environments such as those of lighting applications as the decrease in power and change in chromaticity are suppressed over a long period of time.

Light Source

As the light source (hereinafter, also referred to as an "excitation light source"), one that emits light having a wavelength in a range of 380 nm to 485 nm, a short-wavelength region of visible light, is used. The light source has an emission peak wavelength (maximum emission wavelength) preferably in a wavelength range of 420 nm to 485 nm, more preferably in a wavelength range of 440 nm to 480 nm. Thus, the fluoride fluorescent material can be efficiently excited to effectively utilize visible light. Use of an excitation light source with a wavelength in the above-mentioned range provides a light emitting device having high emission intensity.

Preferably, a semiconductor light emitting element (hereinafter, also referred to simply as a "light emitting element") is used for the excitation light source. Use of a semiconductor light emitting element for the excitation light source gives a stable light emitting device which has high efficiency and high linearity of output to input and which is resistant to mechanical impact.

As the light emitting element, one that emits light in a short-wavelength region of visible light can be used. For example, as a blue or green light emitting element, one including a nitride-based semiconductor ($In_XAl_YGa_{1-X-Y}N$, $0 \leq X$, $0 \leq Y$, $X+Y \leq 1$) can be used.

Fluoride Fluorescent Material

Details of the fluoride fluorescent material included in the light emitting device are as described above. For example, a light emitting device can be formed with the fluoride fluorescent material contained in a sealing resin that covers an excitation light source. In a light emitting device in which an excitation light source is covered with a sealing resin containing the fluoride fluorescent material, light emitted from the excitation light source is partially absorbed in the fluoride fluorescent material, and radiated as red light. Use of an excitation light source that emits light having a wavelength in a range of 380 nm to 485 nm enables more effective utilization of radiated light. Accordingly, the loss of light emitted from the light emitting device can be reduced, so that a highly efficient light emitting device can be provided.

The content of the fluoride fluorescent material included in the light emitting device may be appropriately selected according to an excitation light source or the like.

Additional Fluorescent Material

Preferably, the light emitting device further includes an additional fluorescent material in addition to the above-mentioned fluoride fluorescent material. The additional fluorescent material is only required to absorb light from the light source, and convert the light into light having a different wavelength.

For example, a light emitting device can be formed with the additional fluorescent material contained in a sealing resin as in the case of the above-mentioned fluoride fluorescent material.

The additional fluorescent material is preferably at least one selected from the group consisting of, for example, a nitride-based fluorescent material, an oxynitride-based fluorescent material and a sialon-based fluorescent material, each of which is activated mainly with a lanthanoid element such as Eu or Ce; an alkaline earth halogen apatite fluorescent material, an alkaline earth metal boric acid halogen fluorescent material, an alkaline earth metal aluminate fluorescent material, an alkaline earth silicate, an alkaline earth sulfide, an alkaline earth thiogallate, an alkaline earth silicon nitride and a germanate, each of which is activated mainly with a lanthanoid element such as Eu or a transition metal element such as Mn; a rare earth aluminate and a rare earth silicate, each of which is activated mainly with a lanthanoid element such as Ce; and an organic complex and an inorganic complex, each of which is activated mainly with a lanthanoid element such as Eu.

Specific examples of the additional fluorescent material include $(Ca,Sr,Ba)_2SiO_4$:Eu, $(Y,Gd,Lu)_3(Ga,Al)_5O_{12}$:Ce, $(Si,Al)_6(O,N)_8$:Eu (β-sialon), $SrGa_2S_4$:Eu, $(Ca,Sr)_2Si_5N_8$:Eu, $CaAlSiN_3$:Eu, $(Ca,Sr)AlSiN_3$:Eu, $(Ca,Sr,Ba)_8MgSi_4O_{16}(F,Cl,Br)_2$:Eu, $La_3Si_6N_{11}$:Ce, $Ca_3Sc_2Si_3O_{12}$:Ce, $CaSc_2O_4$:Ce and $Ba_3Si_6O_{12}N_2$:Eu.

Inclusion of additional fluorescent materials provides a light emitting device having various color tones.

When the light emitting device further includes an additional fluorescent material, the content of the fluorescent material is not particularly limited, and may be appropriately adjusted so as to obtain desired light-emitting characteristics.

When the light emitting device further includes an additional fluorescent material, the light emitting device preferably includes a green fluorescent material, more preferably includes a green fluorescent material that absorbs light having a wavelength in a range of 380 nm to 485 nm, and emits light having a wavelength in a range of 495 nm to 573 nm. When the light emitting device includes a green fluorescent material, the light emitting device can be more suitably used in lighting devices, liquid crystal display devices and the like.

When the light emitting device includes a green fluorescent material, the full half-value width of the emission spectrum of the green fluorescent material is preferably 100 nm or less, more preferably 70 nm or less because an object to be lightened or an image shows a deeper green color when the light emitting device is used in a lighting device or an image display device.

Examples of the green fluorescent material may include Eu-activated halosilicate fluorescent materials having a composition represented by the formula $M^{11}_8MgSi_4O_{16}X^{11}_2$:Eu($M^{11}$=Ca, Sr, Ba; $X^{11}$=F, Cl, Br); Eu-activated silicate fluorescent materials having a composition represented by the formula $M^{12}_2SiO_4$:Eu $M^{12}$=Mg, Ca, Sr, Ba, Zn); Eu-activated β-sialon fluorescent materials having a composition represented by the formula $Si_{6-z}Al_zO_zN_{8-z}$:Eu (0<z<4.2); Eu-activated thiogallate fluorescent materials having a composition represented by the formula $M^{13}Ga_2S_4$:Eu ($M^{13}$=Mg, Ca, Sr, Ba); and rare earth aluminate fluorescent materials having a composition represented by the formula $(Y,Lu)_3Al_5O_{12}$:Ce. Particularly, from a viewpoint of color tone, color reproduction range and so on, the green fluorescent material is preferably at least one selected from the group consisting of a Eu-activated halosilicate fluorescent material, a Eu-activated silicate fluorescent material, a Eu-activated β-sialon fluorescent material, a Eu-activated thiogallate fluorescent material and a rare earth aluminate fluorescent material, more preferably a Eu-activated β-sialon fluorescent material.

The type of the light emitting device is not particularly limited, and may be appropriately selected from types that are usually used. Examples of the type of the light emitting device may include a shell type and a surface mounting type. Generally, the shell type refers to a light emitting device in which a resin that forms the outer surface is formed into a shell shape. The surface mounting type refers to a light emitting device formed by filling a recessed storage portion with a light emitting element as a light source, and a resin. Examples of the type of the light emitting device further include a light emitting device in which a light emitting element as a light source is mounted on a flat mounting substrate, and a sealing resin containing a fluoride fluorescent material is formed into a lens shape so as to cover the light emitting element.

Figure 1:
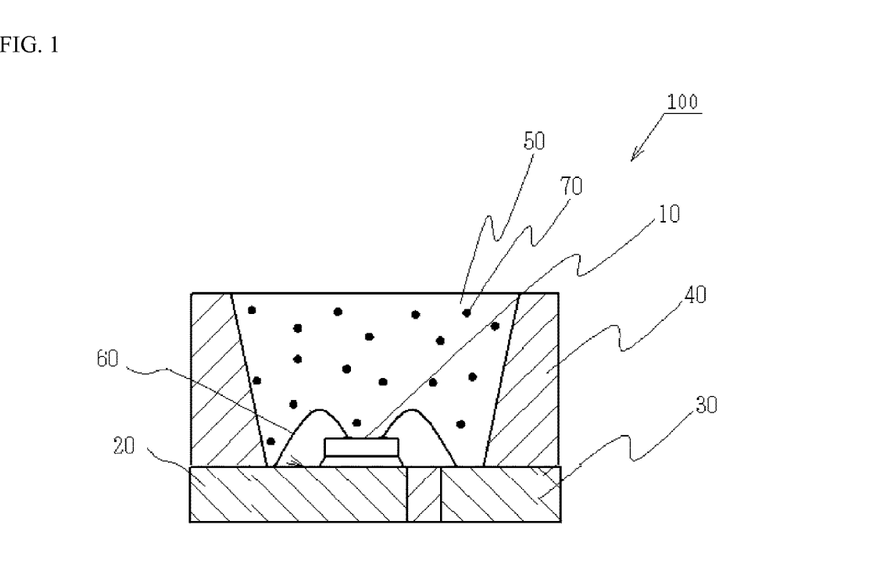
FIG. 1 is a schematic sectional view showing one example of a light emitting device according to an embodiment.

One example of the light emitting device according to the present embodiment will be described below with reference to the drawings. FIG. 1 is a schematic sectional view showing one example of the light emitting device according to this embodiment. The light emitting device is one example of a surface mounting type-light emitting device.

The light emitting device 100 includes a light emitting element 10 made of a gallium nitride-based compound semiconductor, which emits light having a shorter wavelength of visible light (e.g. 380 nm to 485 nm); and a molded body 40 on which the light emitting element 10 is placed. The molded body 40 includes a first lead 20 and a second lead 30, and is molded integrally with a thermoplastic resin or a thermosetting resin. The molded body 40 forms a recess having a bottom surface and side surfaces, and the light emitting element 10 is placed on the bottom surface of the recess. The light emitting element 10 includes a pair of positive and negative electrodes, and the pair of positive and negative electrodes are electrically connected to the first lead 20 and the second lead 30 through a wire 60. The light emitting element 10 is sealed with a sealing member 50. Preferably, a thermosetting resin such as an epoxy resin, a silicone resin, an epoxy-modified silicone resin or a modified silicone resin is used for the sealing member 50. The sealing member 50 contains a fluoride fluorescent material 70 that wavelength-converts light from the light emitting element 10.

EXAMPLES

The present invention will be described in detail below by way of examples, but the present invention is not limited to these examples.

Production Example 1

$KHF_2$ was weighed (156.2 g), and dissolved in 710 g of a 55 mass % aqueous HF solution to prepare a solution A. $K_2MnF_6$ was weighed (15.7 g), and dissolved in 400 g of a 55 mass % aqueous HF solution to prepare a solution B. An aqueous solution (280 g) containing 112 g of $H_2SiF_6$ was prepared as a solution C containing 40% by mass of $H_2SiF_6$. The molality of the fluorine element contained in the solution C was 27.8 mol/kg.

Next, the solution A was stirred at room temperature while the solution B and the solution C were added dropwise thereto over about 20 minutes. The resulting precipitate was subjected to solid-liquid separation, then washed with ethanol, and dried at 90° C. for 10 hours to prepare fluoride particles.

As a fluoride fluorescent material of Comparative Example 1 below, the fluoride particles obtained in Production Example 1 were used as such.

Example 1

In 10 g of a 55% aqueous hydrofluoric acid solution was dissolved 2.5 g of $KHF_2$ to prepare a liquid medium 1. The liquid medium 1 and 10 g of the fluoride particles obtained in Production Example 1 were added in an autoclave coated with a fluororesin, and were subjected to a heating/pressurization treatment at 120° C. and about 2.3 MPa for 8 hours. The treated product was subjected to solid-liquid separation, then washed with ethanol, and dried at 70° C. for 10 hours to prepare a fluoride fluorescent material 1.

Example 2

A fluoride fluorescent material 2 was prepared in the same manner as in Example 1 except that the heating/pressurization treatment time was changed to 21 hours.

Example 3

In 12.5 g of a 55% aqueous hydrofluoric acid solution was dissolved 2.5 g of $KHF_2$ to prepare a liquid medium 3. The liquid medium 3 and 10 g of the fluoride particles obtained in Production Example 1 were added in an autoclave coated with a fluororesin, and were subjected to a heating/pressurization treatment at 150° C. and about 5.0 MPa over 8 hours. The treated product was subjected to solid-liquid separation, then washed with ethanol, and dried at 70° C. for 10 hours to prepare a fluoride fluorescent material 3.

Example 4

A fluoride fluorescent material 4 was prepared in the same manner as in Example 3 except that the heating temperature was changed to 170° C. and the pressure was changed to about 7.5 MPa.

Evaluation

Emission Brightness Characteristics

For each of the obtained fluoride fluorescent materials, usual measurement of emission brightness characteristics was performed. The emission brightness was measured as a reflection brightness under the condition of an excitation wavelength of 460 nm. The brightness was evaluated as a relative brightness to an untreated fluoride fluorescent material. The measurement results are shown in Table 1.

Durability: Laser Degradation Rate

A semiconductor laser that emits light having a wavelength of 450 nm was provided, and temperature control was performed for stabilizing the optical output. In a cell (capacity: 0.31 cc) for powder brightness measurement, 0.34 g of the fluoride fluorescent material was set, and the fluoride fluorescent material in the cell was continuously irradiated with light outputted from the semiconductor laser. At this time, the current applied to the semiconductor laser was adjusted so that the optical density was 3.5 W/cm². Light from a section irradiated with laser light was taken in a photomultiplier tube to measure a change in powder brightness. At this time, laser light reflected from the fluorescent material was eliminated using an optical filter in order to eliminate influences of laser light on the powder brightness. The light-emitting energy efficiency was calculated from the reflectance and emission brightness of excitation light having a wavelength of 460 nm.

Figure 2:
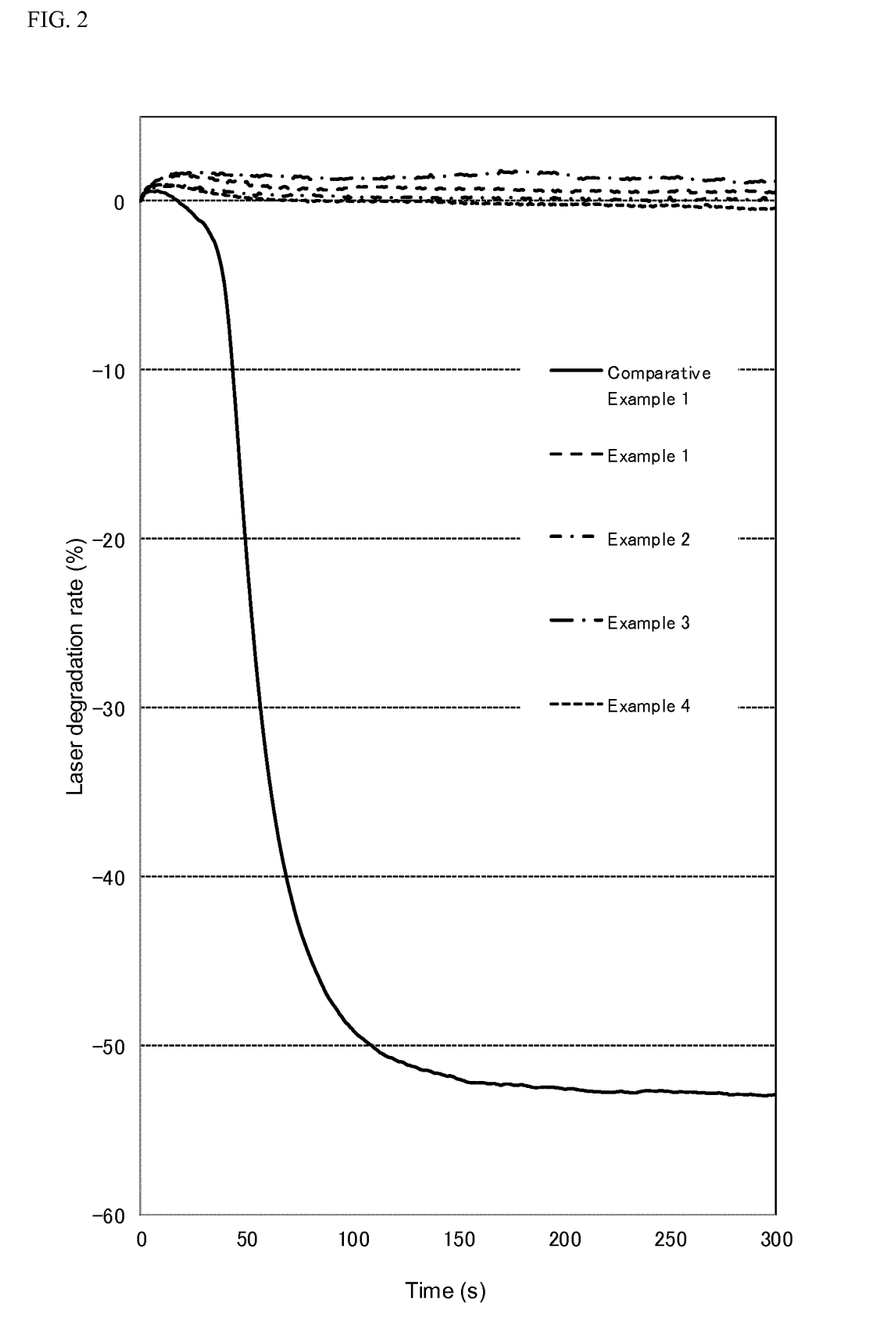
FIG. 2 is a graph showing the results of a durability evaluation test using laser light for a fluoride fluorescent material according to this embodiment.

The rate of decrease in light-emitting energy efficiency after application of laser light for 300 seconds is shown in Table 1. The time-dependent change in light-emitting energy efficiency, which is associated with laser light irradiation, is shown in FIG. 2 as a laser degradation rate.

Reflectance

Figure 3:
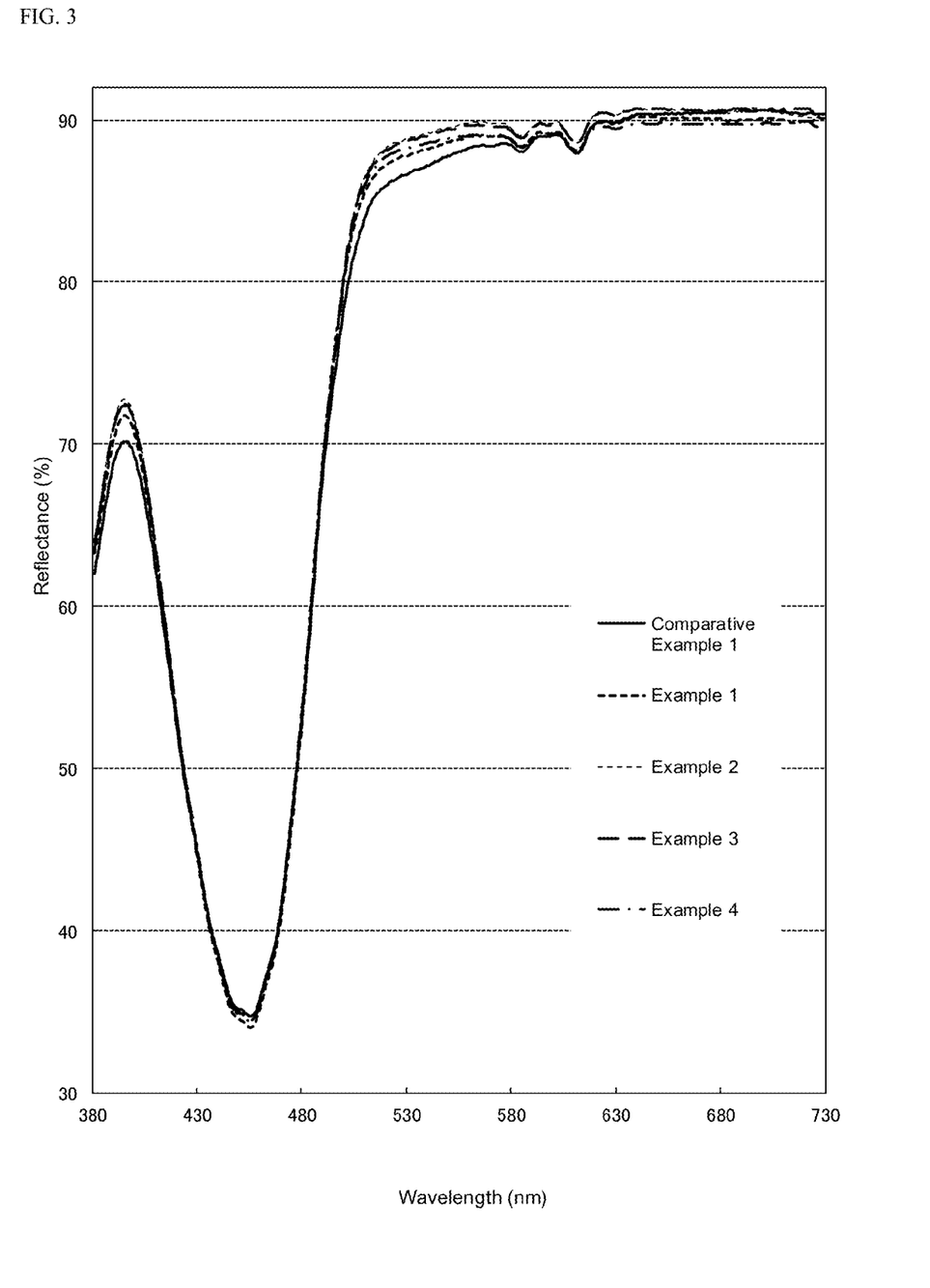
FIG. 3 is a reflection spectrum of a fluoride fluorescent material according to this embodiment.

For each of the obtained fluoride fluorescent materials, the reflectance at a wavelength of 510 nm was measured under the condition of 25° C. using a fluorescence spectrophotometer F-4500 (manufactured by Hitachi High-Technologies Corporation). The results are shown in Table 1. Reflectance spectra at a wavelength of 380 to 730 nm are shown in FIG. 3.

High-Temperature/High-Humidity Environment Test

Each of the obtained fluoride fluorescent materials was left standing for 100 hours under a high-temperature/high-humidity environment at a temperature of 85° C. and a relative humidity of 85%. The emission brightness was measured before and after the high-temperature/high-humidity environment test, and the rate of decrease in emission brightness after the test was calculated on the basis of the emission brightness before the test. The results are shown in Table 1 as the rate (%) of decrease in brightness after the high-temperature/high-humidity environment test.

Here, like other characteristics, the emission brightness was measured using a fluorescence spectrophotometer F-4500 (manufactured by Hitachi High-Technologies Corporation).

TABLE 1

| | Emission brightness characteristics | | Laser degradation rate (%) | Reflectance (%) | Rate of decrease in brightness after high-temperature/high-humidity environment test (%) |
|---|---|---|---|---|---|
| | Chromaticity coordinates | Relative brightness | | | |
| | x | y | (%) | | | |
| Example 1 | 0.678 | 0.312 | 101 | ≤0.1 | 85.6 | 0 |
| Example 2 | 0.678 | 0.312 | 103 | ≤0.1 | 86.5 | 0 |
| Example 3 | 0.678 | 0.312 | 103 | ≤0.1 | 86.2 | 0 |
| Example 4 | 0.678 | 0.312 | 104 | ≤0.1 | 85.9 | 0 |
| Comparative Example 1 | 0.678 | 0.312 | 100 | ≥50 | 83.9 | 4 |

From Table 1, it is apparent that the fluoride fluorescent material obtained by the production method of this embodiment shows excellent durability. It is also apparent that the fluoride fluorescent material has a high reflectance at a wavelength of 510 nm.

As shown in Table 1, it is apparent that in the fluoride fluorescent material of Comparative Example 1, the emission brightness decreased by 4% after the high-temperature/high-humidity environment test, i.e. the emission brightness decreased to 96% of that before the start of the test, whereas in the fluoride fluorescent materials of Examples 1 to 4, the emission brightness did not decrease.

SEM Image

SEM images of the fluoride fluorescent materials were obtained using a scanning electron microscope (SEM).

Figure 4:
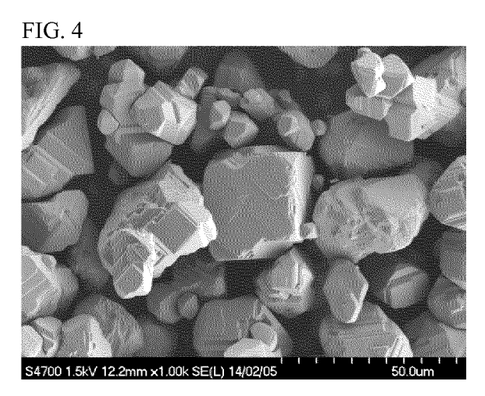
FIG. 4 shows one example of a SEM image of a fluoride fluorescent material according to Example 1.
Figure 5:
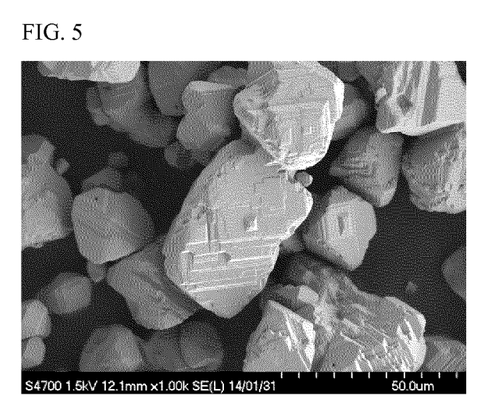
FIG. 5 shows one example of a SEM image of a fluoride fluorescent material according to Example 2.
Figure 6:
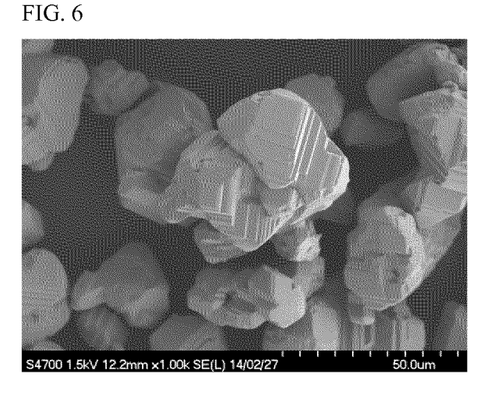
FIG. 6 shows one example of a SEM image of a fluoride fluorescent material according to Example 3.
Figure 7:
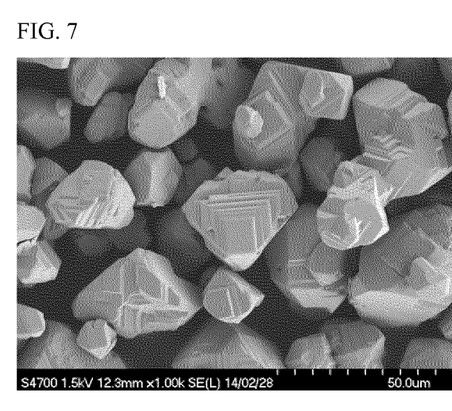
FIG. 7 shows one example of a SEM image of a fluoride fluorescent material according to Example 4.
Figure 8:
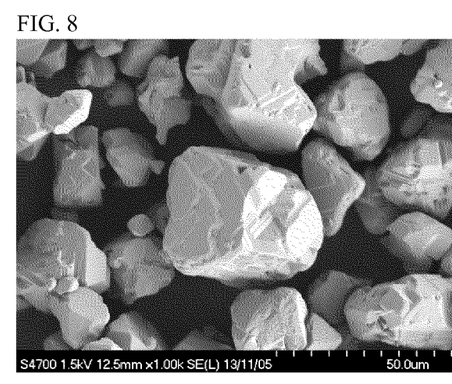
FIG. 8 shows one example of a SEM image of a fluoride fluorescent material according to Comparative Example 1.

The SEM image of the fluoride fluorescent material obtained in Example 1 is shown in FIG. 4, the SEM image of the fluoride fluorescent material obtained in Example 2 is shown in FIG. 5, the SEM image of the fluoride fluorescent material obtained in Example 3 is shown in FIG. 6, the SEM image of the fluoride fluorescent material obtained in Example 4 is shown in FIG. 7, and the SEM image of the fluoride fluorescent material obtained in Comparative Example 1 is shown in FIG. 8.

Unevenness on the surfaces of fluoride fluorescent material particles can be more clearly observed after the treatment than before the treatment. Since unevenness occurs on the surfaces of particles, fluoride fluorescent material particles may be recrystallized through the treatment according to the present disclosure. Reduction of defects and stabilization in the vicinity of $Mn^{4+}$ may be realized during the recrystallization.

Examples 5 to 8 and Comparative Example 2

Light emitting devices of Examples 5 to 8 and Comparative Example 2 were prepared using the fluoride fluorescent materials that is red fluorescent materials of Examples 1 to 4 and Comparative Example 1. A semiconductor light emitting element having a main wavelength of 451 nm was sealed with a sealing material, in which 72 parts by mass of a fluoride fluorescent material and 28 parts by mass of β-sialon as a green fluorescent material were dispersed in 100 parts by mass of a silicone resin, to prepare a light emitting device.

The fluoride fluorescent material of Example 1 was used for preparation of the light emitting device of Example 5, the fluoride fluorescent material of Example 2 was used for preparation of the light emitting device of Example 6, the fluoride fluorescent material of Example 3 was used for preparation of the light emitting device of Example 7, the fluoride fluorescent material of Example 4 was used for preparation of the light emitting device of Example 8, and the fluoride fluorescent material of Production Example 1 was used as such for preparation of the light emitting device of Comparative Example 2.

Durability of Light Emitting Device: LED Durability

Each of the light emitting devices of Examples 5 to 8 and Comparative Example 2 obtained in the manner described above was continuously ignited at a current value of 150 mA under an environment at 85° C., and the total light flux amount and the x value in the chromaticity coordinates were measured after elapse of 70 hours. For each of the total light flux and the x value, each of the amount of change in total light flux and the amount of change in x value from the initial value in the light emitting device including the fluoride fluorescent material of Comparative Example 1 was set to 100, and the amount of change in total light flux and the amount of change in x value in the light emitting device including the fluoride fluorescent material obtained in each example were relatively evaluated as an amount of change in light flux and a Δx change amount, respectively. The results are shown in Table 2 below.

The amount of change in light flux and the Δx change amount each show an amount of change from the initial value in each light emitting device, and for each of the amount of change in light flux and the Δx change amount, a smaller value corresponds to a better result. Examples 5 to 8 have a smaller amount of change in light flux and a smaller Δx change amount as compared to Comparative Example 2. That is, this means that Examples 5 to 8 maintain a light flux amount and an x value each closer to the initial value as compared to Comparative Example 2, and it is thus apparent that Examples 5 to 8 are superior in durability of the light emitting device to Comparative Example 2.

TABLE 2

|  | LED durability | |
| --- | --- | --- |
|  | Amount of change in light flux | Δx change amount |
| Example 5 | 71 | 89 |
| Example 6 | 76 | 84 |
| Example 7 | 68 | 83 |
| Example 8 | 52 | 80 |
| Comparative Example 2 | 100 | 100 |

A fluoride fluorescent material according to the present disclosure is excellent in durability, and a light emitting device including the fluoride fluorescent material has suppressed time-dependent power decline and change in chromaticity, can be used particularly in backlight light sources for liquid crystals with a blue light emitting diode as a light source, general lighting light sources, LED displays, traffic signals, lighting switches, various kinds of sensors and various kinds of indicators and the like, and exhibits excellent durability and light-emitting characteristics particularly in applications of backlight for liquid crystal display.

As described above, it should be obvious that various other embodiments are possible without departing the spirit and scope of the present invention. Accordingly, the scope and spirit of the present invention should be limited only by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a fluoride fluorescent material, comprising:
   subjecting a mixture that contains a fluoride compound in a liquid medium to a pressurization treatment and a heating treatment, the fluoride compound having a chemical composition represented by the following formula (I):

$$A_2[M_{1-a}Mn^{4+}{}_aF_6] \quad (I)$$

wherein A is at least one cation selected from the group consisting of $K^+$, $Li^+$, $Na^+$, $Rb^+$, $Cs^+$ and $NH_4^+$, M is at least one element selected from the group consisting of Group 4 elements and Group 14 elements, and a is a number that satisfies $0<a<0.2$, and
   wherein the pressurization treatment is performed at a pressure of 1.5 MPa or higher.

2. The method according to claim 1, wherein the heating treatment is performed at a temperature of 100° C. or higher.

3. The method according to claim 1, wherein the liquid medium is an aqueous medium.

4. The method according to claim 1, wherein the liquid medium contains potassium.

5. The method according to claim 1, wherein an amount of a liquid medium used in the pressurization treatment is in a range of 100 to 160 parts by mass based on 100 parts by mass of the fluoride compound.

6. The method according to claim 1, wherein an amount of a liquid medium used in the pressurization treatment is in a range of 130 to 160 parts by mass based on 100 parts by mass of the fluoride compound.

\* \* \* \* \*